Sept. 19, 1961 J. C. MARINACE 3,000,768

SEMICONDUCTOR DEVICE WITH CONTROLLED ZONE THICKNESS

Filed May 28, 1959

INVENTOR
JOHN C. MARINACE

BY *Alvin J. Riddles*
ATTORNEY

United States Patent Office 3,000,768
Patented Sept. 19, 1961

3,000,768
SEMICONDUCTOR DEVICE WITH CONTROLLED ZONE THICKNESS

John C. Marinace, Yorktown Heights, N.Y., assignor to International Business Machines Corporation, New York, N.Y., a corporation of New York
Filed May 28, 1959, Ser. No. 816,573
1 Claim. (Cl. 148—1.5)

This invention relates to the fabrication of semiconductor structures and in particular to the fabrication of a precise thickness zone semiconductor device.

In several types of semiconductor devices it is desirable that the physical distance through one conductivity type zone from one junction to another be confined to a dimension so small that the usual fabrication techniques of cutting and contact formation have been found to be inadequate to consistently manufacture such devices with identical performance characteristics without cut and try type operations. Specifically, the two most widely recognized device requirements where a very thin zone is essential, are the base zone of a transistor, and the intermediate zone adjacent to the base of a "PN hook" collector type of transistor.

In these cases the thickness dimension from one PN junction is usually first established and then a second PN junction is provided on the surface of the established thickness zone. In addition to the problems of the actual forming of the small thickness zone, an associated problem is encountered in that the standard techniques for the formation of PN junctions involve the introduction into the semiconductor material of conductivity type determining impurities and this introduction operates to position the resulting junction within the semiconductor material at a place separated from the established dimension at the surface.

What has been discovered is a semiconductor structure and method of manufacturing it wherein a thickness dimension in a particular conductivity type zone is precisely established adjacent to a first PN junction, the exact location of which is not known, and, a second PN junction is formed at the precise established distance.

It is an object of this invention to provide an improved method of forming a precise thin region between two PN junctions in a semiconductor device.

It is another object of this invention to provide an improved thin region semiconductor device.

It is still another object of this invention to provide an improved three zone transistor.

It is still another object of this invention to provide an improved method of establishing a thin dimension with respect to a junction in a semiconductor device.

It is still another object of this invention to provide an improved method of forming a current amplifying semiconductor connection.

Other objects of the invention will be pointed out in the following description and claims and illustrated in the accompanying drawings, which disclose, by way of example, the principle of the invention and the best mode which has been contemplated of applying that principle.

Figures 4A, 4B, 4C:
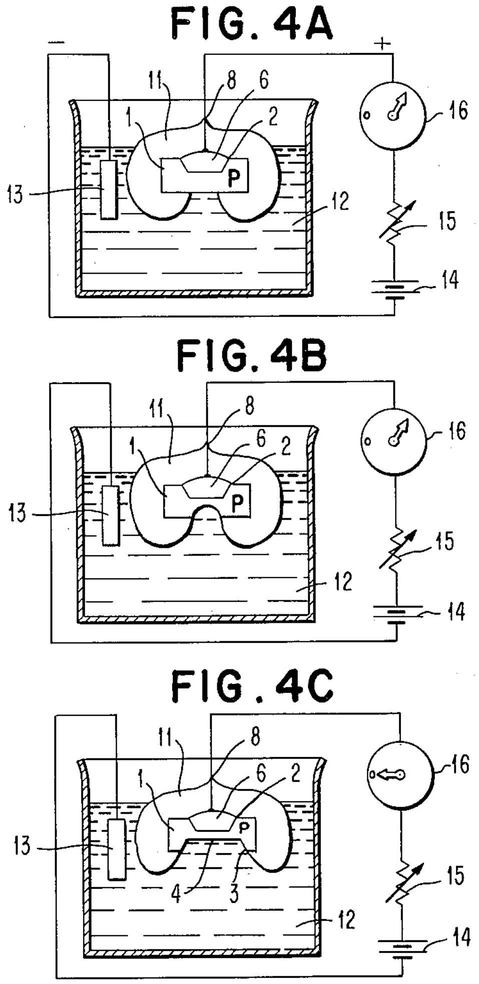

FIGURES 4A, 4B, and 4C are schematic illustrations of the etching operation forming a step involved in the invention.

Figure 5:
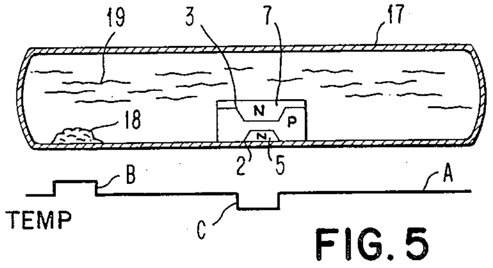

FIGURE 5 is a schematic illustration of semiconductor deposition involved in the invention.

Figure 1:
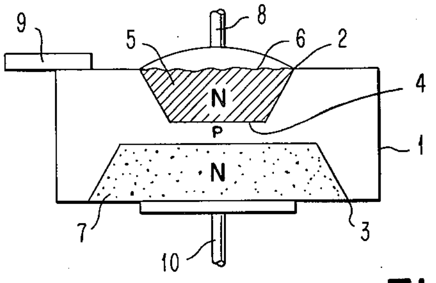
FIGURE 1 is a semiconductor device illustrating a structure produced in accordance with the invention.

Referring now to FIGURE 1 a semiconductor structure is shown comprising a semiconductor body 1 of P conductivity type in which two parallel PN junctions 2 and 3 are separated by a thin but precise portion 4. The junction 2 is illustrated as being formed by the alloy junction technique wherein a recrystallized region 5 of N conductivity type and alloy button 6 are formed in a manner well-known in the art. The junction 3 is formed by deposition of opposite conductivity type semiconductor material in a depression in the crystal outlined by the junction 3. The technique of deposition is performed by the decomposition of a compound of a transport element and a source of the semiconductor material in a manner that free semiconductor material is deposited epitaxially in the depression in the crystal that serves as a substrate. Since the deposit is epitaxial, the crystalline orientation and periodicity of the substrate is maintained. The deposited semiconductor material is labelled element 7 and shown with N conductivity type. The device of FIGURE 1 is usable as a transistor with the application of ohmic contacts 8, 9, and 10 serving as emitter, base and collector contacts respectively.

Figure 2:
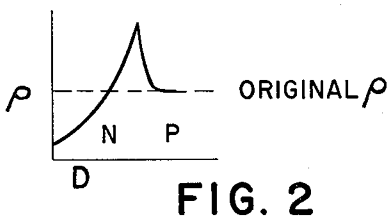
FIGURE 2 is a graph showing the effect of conductivity type impurity introduction in forming a PN junction in semiconductor material.

In the fabrication of PN junctions in semiconductor devices, conductivity type determining impurities are introduced into the semiconductor material, in which, assuming that the semiconductor material has a particular conductivity type and resistivity, a given quantity of conductivity type impurities are already present. It has been established in the art that the predominance of one conductivity type impurity over the opposite type impurity determines the conductivity type of the semiconductor material and that the net quantity of one conductivity type impurity predominating over the opposite conductivity type impurity in the semiconductor material determines the resistivity (symbolized $\rho$) of the semiconductor material. A PN junction is formed in the semiconductor material at the point in the crystal where the quantities of N and P type impurities are in balance. It is difficult to precisely establish the point of balance, and hence the exact location of a PN junction such as 2 in FIGURE 1 in semiconductor material, which is a point from which to start in forming the device of FIGURE 1, is not precisely established. The problem is graphically depicted in FIGURE 2 wherein resistivity $\rho$ is plotted with respect to distance in semiconductor material. The original resistivity is shown dotted and the original conductivity type is illustrated as P. As N conductivity type determining impurities are introduced from a surface corresponding to the origin, they reduce the net quantity of P conductivity type determining impurities predominating in the crystal and this raises the resistivity $\rho$.

Where the N and P conductivity type impurity concentrations are in balance a PN junction is formed and the resistivity $\rho$ is at the highest value. The net quantity of N over P conductivity type determining impurities is greatest near the surface through which the N conductivity type impurity was introduced as shown by the lower resistivity near the origin. The orders of magnitude involved at a junction are in the range of micro-inches.

Thus it may be seen that a definite positioning of a PN junction is extremely difficult to establish. The establishment of the exact location is further complicated by the fact that current methods available in the art to locate a PN junction in semiconductor material are only accurate to about an order of magnitude of the thickness of the region 4 in FIGURE 1, so that the location of a junction from which to measure a thickness dimension at the current state of the art is a combination of a prediction based upon the process used and a highly inaccurate measurement. Further, difficulties are frequently encountered that interfere with the degree of parallelism of the junction, in other words, how planar the junction 2 is along the region 4. The effect of the parallelism problem is reduced somewhat by orienting the crystal 1 so that the junction 2 is made through a surface parallel to the III crystallographic plane known in the art, but this solution does not eliminate the problem, since exact crystallographic orientation requires complicated operations and for efficiency approximations are used. In addition, crystal imperfections permit jaggedness in the junction due to impurities entering the imperfections.

This invention provides a technique of forming a structure wherein the thin region follows precisely the configuration of the PN junction, such as 2, the exact location of which does not have to be precisely established, and, the deposited region forms the second junction at exactly an established surface of the thin region.

Figure 3:
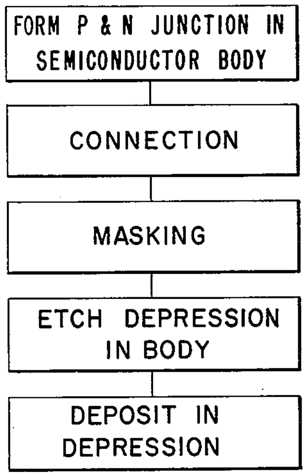
FIGURE 3 is a flow chart of the steps involved in performing the invention.

Referring now to FIGURES 3 and 1 in accordance with the invention a flow chart of a process is shown for achieving the structure as shown in FIGURE 1. In accordance with the invention, a semiconductor body such as 1 in FIGURE 1 is first provided with a PN junction in one surface which may be placed there by alloying, diffusion, etc. The body 1 is in the form of a wafer having two principal surfaces separated by a thickness dimension that is small relative to the sizes of the surfaces. A connection 8 is next made to the PN junction for attachment to an external current source to be later described. The body is next masked in such a way that a region is exposed on the opposite surface of the body from the PN junction, the remainder of the body being coated with the mask with only the external connection 8 protruding. The masking is done with a suitable plastic that will not react with a sodium or potassium hydroxide type etching solution to be later described. The body 1 is next etched in an operation whereby the body 1, through the contact 8 made to the PN junction is made the anode in a hydroxide type etching bath.

Referring now to FIGURES 4A, 4B, and 4C, an example of the etching step performed in accordance with this invention is illustrated.

Referring to FIGURE 4A, the body 1 with the PN junction 2 which is illustrated as alloy connection 6 in crystal 1 with an electrical connection 8 is shown masked with a suitable masking material 11. The body 1 is suspended in hydroxide etching solution 12. A cathode 13 for example of nickel or stainless steel, is provided in the bath 12. Assuming the body 1 to be made of P conductivity type semiconductor material, a source of power 14 having its positive terminal connected through a variable resistance 15 and a meter 16 is connected to the external lead 8, and the negative terminal thereof is connected to the cathode 13. This polarity operates to reverse bias the PN junction 2 and sets up a region in the body adjacent to the junction. The region is devoid of carriers and is known in the art as a depletion region. By varying the variable resistor 15, the etching proceeds as shown in FIGURE 4B. In an intermediate period during the process of the etching, as depicted by FIGURE 4B the current remains essentially constant as indicated by the meter 16 as a portion of the body in the unmasked region is being etched away. When the etched away portion reaches the arbitrarily set thickness of the depletion region which depends upon the voltage from power source 14 up to a limit imposed by the character of the junction, the current indicated by the meter drops sharply as shown in FIGURE 4C so that this establishes the desired thickness of the thin region 4. It will thus be apparent with this technique that knowledge of the exact location of the PN junction 2 is unnecessary, it being necessary to only know a correlation for calibration purposes between the amount of current on meter 16 set by the resistor 15 required to establish the thickness of the depletion region set up associated with the junction which in turn controls how much of the crystal 1 will be unaffected by the etching. Since the depletion region radiates at all points equidistantly from the PN junction 2, a flat etched region surface precisely parallel with all contours of the junction will be formed in the depression etched out of the crystal 1. The surface in the depression will be parallel to the junction regardless of the crystalline orientation and will follow any raggedness of the junction due to crystal imperfections. This surface has been given the reference numeral 3 to indicate its correspondence with the PN junction 3 shown in connection with FIGURE 1, since the second PN junction, as will be described in a later step, will be formed exactly on this surface.

Returning again to FIGURE 3, the final step in the process is to deposit semiconductor material with the same periodicity and crystalline characteristics as the semiconductor material 1 in the depression formed by the etching operation. This deposit is to be epitaxially applied to the crystalline face 3 in a conductivity type opposite to that of the crystal 1.

Referring now to FIGURE 5, a way is illustrated for such epitaxial deposition. This type of deposition has been carried out in the art by a pyrolitic and a disproportionation-pyrolitic type of chemical reaction, wherein a source of semiconductor material is caused to react with a transport element to form a compound and the compound is caused to decompose releasing the pure semiconductor material which deposits on a crystalline substrate. In accordance with this invention, the semiconductor body with the alloy 6 removed down to the recrystallized material 5 to prevent contamination is placed within the container and a transport type of reaction is provided resulting in an epitaxial deposition of semiconductor material of opposite conductivity type in the etched out depression in the body, in contact with the surface and forming a junction 3. Some techniques for providing such a deposition are shown U.S. Patents 2,692,839 and 2,763,581.

Referring now to FIGURE 5, a sealed type of deposition system is illustrated. A sealed container 17 is provided and maintained at a temperature sufficient to vaporize the ingredients and to form a compound of a transport element and a source of semiconductor material 18, included as ingredients in the container 17. The vaporized compound is illustrated as a gas 19. A temperature profile is established in the tube such that a steady even temperature A shown on the temperature curve below the tube is provided to vaporize the ingredients and to maintain the gas 19. A difference of temperature in the container 17 is established between the source 18 and the substrate which includes the depression formed in the semiconductor body. In the illustration of FIGURE 5, a pyrolitic-disproportionation type of reaction is illustrated wherein the source 18 is maintained at an increment of temperature labelled B, above the steady state labelled A, and the substrate 1 with the exposed crystalline region 3 is maintained slightly below the steady state temperature A and and the decreased temperature is labelled C. Under these conditions, the transport element forms a compound with the source 18 in the form of a gas 19 which carries the semiconductor source material 18 to the substrate including the depression 3 which, being the coolest place in the system decomposes and deposits epitaxially on the crystalline substrate, the semiconductor material labelled 7. In order to insure that the semiconductor material 7 is of a conductivity type opposite to that of the body 1, which for this illustration is P conductivity type, impurities are maintained, either elsewhere in the container or in the source 18, in a quantity sufficient that they will be included in a quantity sufficient to predominate in the deposited material 7. Through the use of N conductivity type determining impurities, N type material 7 is deposited forming a junction at the surface 3. In order to aid in understanding and to provide a starting point for one skilled in the art in practicing the invention, the following set of specifications are provided, it being understood that one skilled in the art in the light of this invention could provide many such sets of individual specifications and that no limitation should be construed thereby.

A semiconductor body 1 of germanium material having a resistivity of 5 ohm centimeters and of P conductivity type, having dimensions 0.020 inch square and a thickness of 0.005 inch is provided with an alloy junction 2 by fusing a 0.005 inch diameter lead-arsenic pellet into one side thereof at a temperature of about 500° C. for ten seconds. An ohmic connection 8 is next made to the alloy junction 2 and the assembly is masked in a coating of polyvinyl chloride or a paraffin type or high molecular weight wax, leaving an opening of 0.010 inch diameter on the side opposite the ohmic connection 8 exposed. A 5% potassium hydroxide, 95% water, bath is then provided with a nickel cathode and a source of positive D.C. current applied to the terminal 8 such that 10 milliamperes flow. At the end of about 2 to 3 minutes current flow essentially ceases in the device and the body has been etched away until a thin web of semiconductor material approximately 0.0004 inch thick remains over the junction 2. The semiconductor body is then placed in a sealed container and maintained at 410° C. along with a quantity of germanium iodide and a source of finely divided 0.1 ohm centimeters, N conductivity type germanium 18 doped with phosphorus. The temperature was raised in the source region to approximately 550° C. and the temperature was reduced at the substrate region where the body was placed at about 400° C. At the end of 48 hours an epitaxial deposit 17 of P conductivity type was observed 0.010 inch thick. Excess deposited material is lapped off the body on the surfaces where not desired.

What has been described is a technique of forming a thin region in the semiconductor body adjacent a junction and then forming a junction at the surface of that thin region so that the precise location of the first junction is not necessary and a very close control of the thickness of the region is relaxed. The second junction is then positioned exactly at the surface of the region, follows all the contours of the first and is exactly parallel thereto.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claim.

What is claimed is:

A method of providing a thin region having a precise dimension between two junctions in a semiconductor body of a first conductivity type comprising the steps of forming a first semiconductor to semiconductor PN junction the exact location of which in said semiconductor body is unknown, applying an electrical connection to said first junction in said semiconductor body, electrolytically etching under a predetermined magnitude of reverse bias condition correlated with a depletion region corresponding to a predetermined dimension said semiconductor body until no appreciable reverse current flows forming thereby an etched interface spaced a distance determined by said predetermined dimension from said first PN junction, and epitaxially depositing opposite conductivity type semiconductor material in the etched region of said semiconductor body whereby said semiconductor body is reinforced in the region adjacent said predetermined dimension and a second semiconductor to semiconductor PN junction is formed precisely at said etched interface.

References Cited in the file of this patent

UNITED STATES PATENTS

| | | |
|---|---|---|
| 2,692,839 | Christensen et al. | Oct. 26, 1954 |
| 2,763,581 | Freedman | Sept. 18, 1956 |
| 2,846,346 | Bradley | Aug. 5, 1958 |
| 2,885,609 | Williams et al. | May 5, 1959 |
| 2,898,248 | Silvey et al. | Aug. 4, 1959 |
| 2,900,584 | Bottom | Aug. 18, 1959 |

FOREIGN PATENTS

| | | |
|---|---|---|
| 745,698 | Great Britain | Feb. 29, 1956 |